United States Patent
Ishii et al.

(10) Patent No.: US 9,811,623 B2
(45) Date of Patent: Nov. 7, 2017

(54) METHOD FOR GENERATING PATTERN, STORAGE MEDIUM, AND INFORMATION PROCESSING APPARATUS

(71) Applicant: CANON KABUSHIKI KAISHA, Tokyo (JP)

(72) Inventors: Hiroyuki Ishii, Shioya-gun (JP); Ryo Nakayama, Utsunomiya (JP); Tadashi Arai, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 192 days.

(21) Appl. No.: 14/802,851

(22) Filed: Jul. 17, 2015

(65) Prior Publication Data

US 2016/0026743 A1   Jan. 28, 2016

(30) Foreign Application Priority Data

Jul. 22, 2014   (JP) ................. 2014-149015

(51) Int. Cl.
  *G06F 17/50* (2006.01)
(52) U.S. Cl.
  CPC ................. *G06F 17/5068* (2013.01)
(58) Field of Classification Search
  USPC .......................................... 716/55
  See application file for complete search history.

(56) References Cited

U.S. PATENT DOCUMENTS

| | | | |
|---|---|---|---|
| 7,873,929 B2 | 1/2011 | Kahng | |
| 2004/0248045 A1 | 12/2004 | Tanaka et al. | |
| 2007/0003127 A1* | 1/2007 | Nakano | G06F 17/5068 |
| | | | 382/144 |
| 2008/0085457 A1 | 4/2008 | Setta | |
| 2009/0100396 A1 | 4/2009 | Smayling | |
| 2013/0275926 A1* | 10/2013 | Wang | G03F 1/36 |
| | | | 716/53 |

FOREIGN PATENT DOCUMENTS

| | | |
|---|---|---|
| JP | 2005-084101 A | 3/2005 |
| TW | 201007366 A | 2/2010 |
| TW | 201104478 A | 2/2011 |

* cited by examiner

*Primary Examiner* — Bryce Aisaka
(74) *Attorney, Agent, or Firm* — Canon USA, Inc. IP Division

(57) ABSTRACT

A method for generating a pattern includes defining a footprint of a main pattern in each cell, arranging a first cell and a second cell which has an auxiliary pattern outside the footprint of the main pattern, side by side in such a manner that the auxiliary pattern outside the footprint of the second cell is present in the footprint of the main pattern of the first cell, and generating the pattern of the mask by removing a pattern element of the auxiliary pattern outside the footprint of the second cell in a portion where the pattern element of the auxiliary pattern outside the footprint of the second cell is close to or overlaps with the main pattern in the first cell of the first cell and the second cell arranged side by side.

20 Claims, 17 Drawing Sheets

FIG. 2
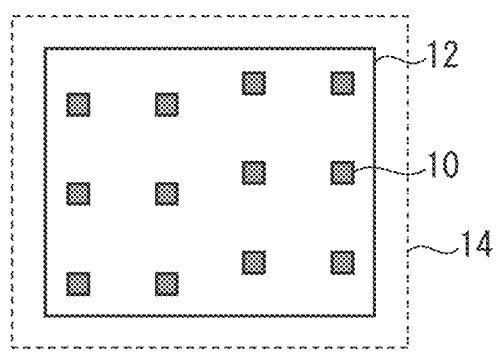
CELL A
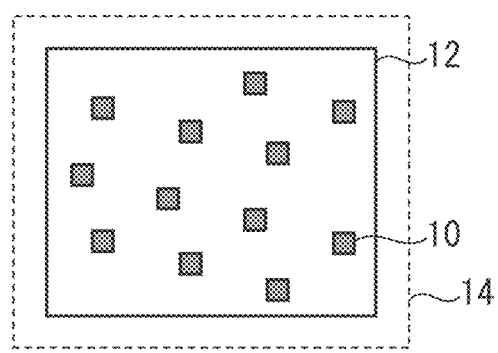
CELL B
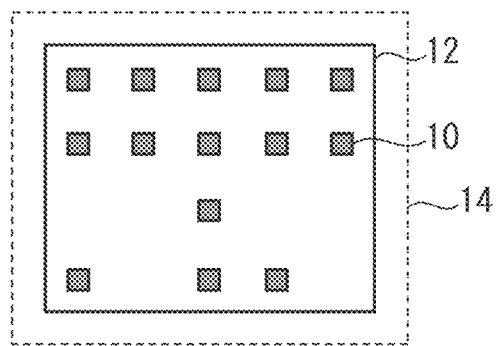
CELL C
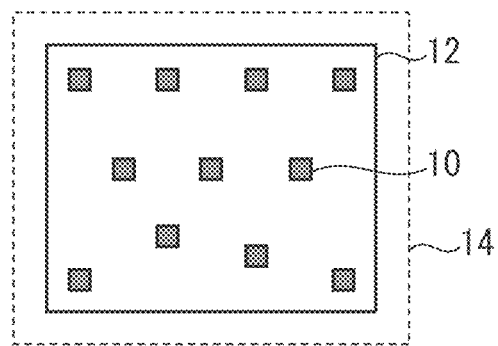
CELL D

FIG. 3
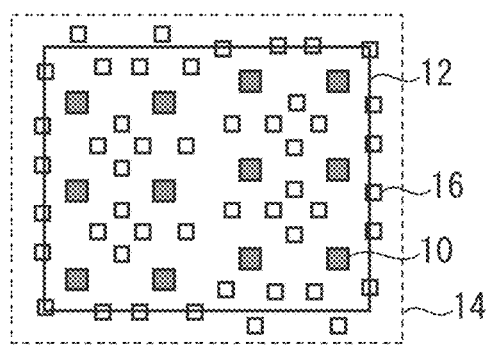
CELL A'
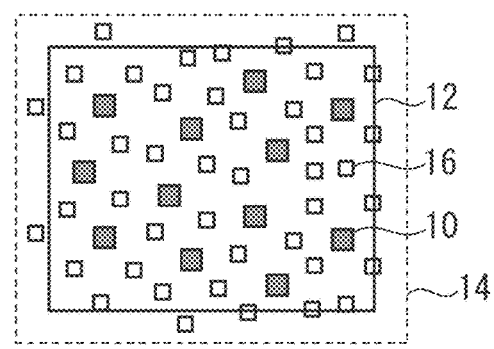
CELL B'
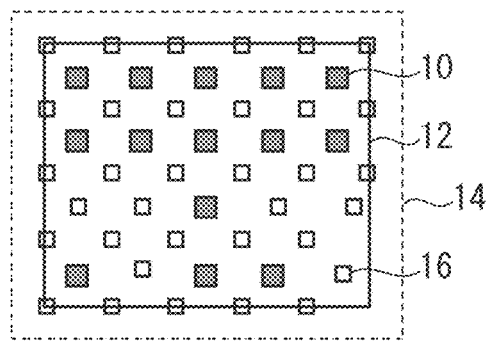
CELL C'
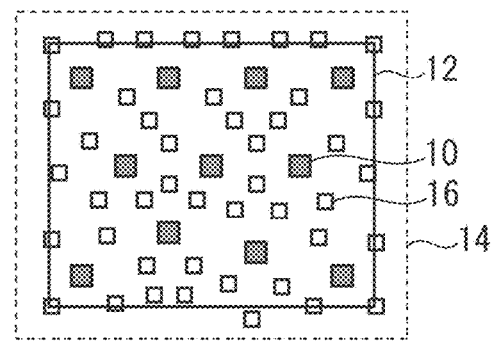
CELL D'

FIG. 11
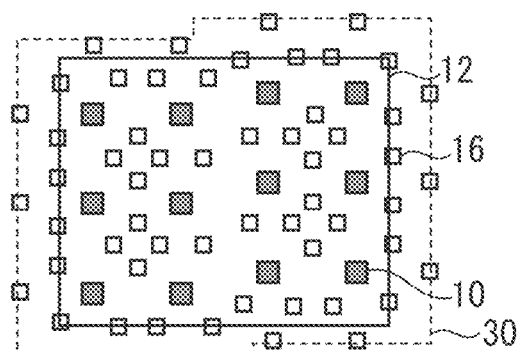
CELL A2
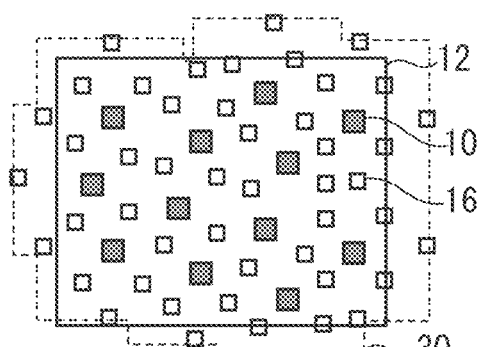
CELL B2
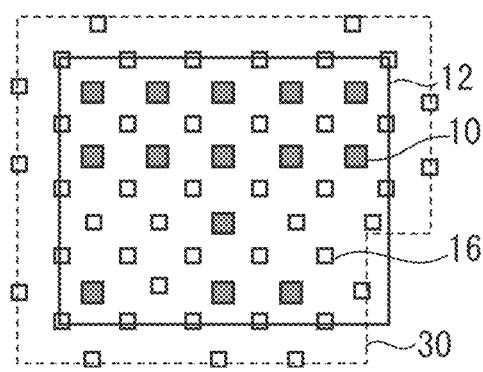
CELL C2
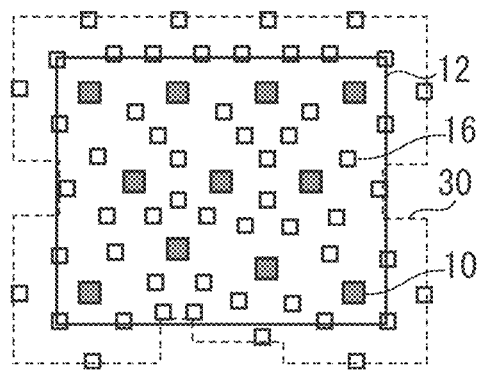
CELL D2

FIG. 15
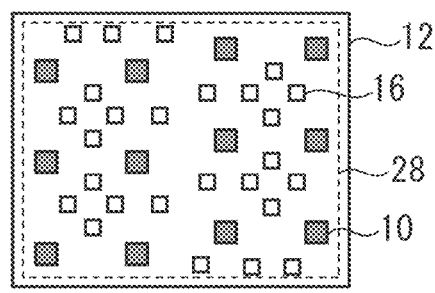
CELL A1
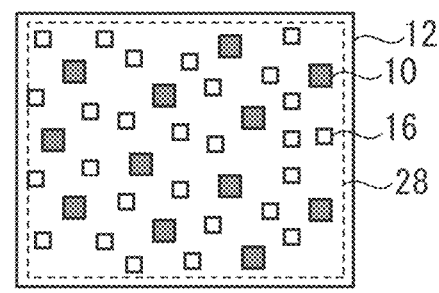
CELL B1
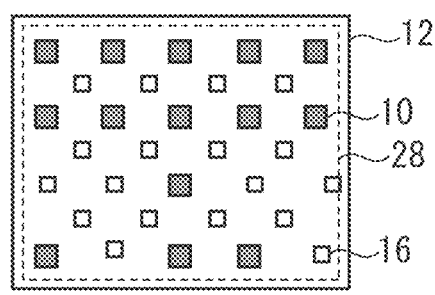
CELL C1
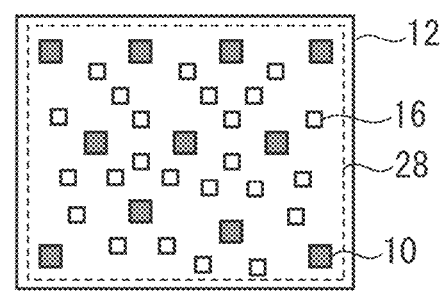
CELL D1

METHOD FOR GENERATING PATTERN, STORAGE MEDIUM, AND INFORMATION PROCESSING APPARATUS

BACKGROUND OF THE INVENTION

Field of the Invention

The present invention relates to a method for generating a pattern, a storage medium, and an information processing apparatus.

Description of the Related Art

Exposure devices including an illumination optical system and a projection optical system have been used in a lithography technique. The illumination optical system illuminates a mask with light from a light source. The projection optical system projects an image of a mask pattern onto a substrate (such as a wafer). When the minimum size of the target pattern to be formed on the substrate falls below the wavelength of the light source used for the exposure, the projection of the image of the mask pattern onto the substrate involves unwanted light interaction (interference) between adjacent patterns. Thus, an unintended image, having a shape different from the target pattern, is formed on the substrate. The larger a difference between the minimum size of the target pattern and the wavelength of the light source, the higher a chance of causing defective resolution of the pattern.

One known method for generating the mask pattern using a computer includes selecting a plurality of cells from a cell library including a large number of standard cells, arranging the cells, and performing optical proximity correction (hereinafter, referred to as OPC) on the plurality of arranged cells. Through the OPC, the shape of each pattern element is corrected in such a manner that the image of the pattern is set to be within a target range. In the OPC, how the formed pattern image is affected by the interference of light between the adjacent patterns is taken into consideration. The cell library includes a plurality of cells forming a basic pattern used for the mask pattern. The plurality of cells includes patterns different from each other.

The amount of calculation for changing the shapes of the pattern elements increases along with the increase in the number of pattern elements. Thus, an extremely large amount of calculation is required when all cells to be used are arranged to generate the mask pattern and then the OPC is performed on the entire mask pattern (full chip). US Patent Application Publication No. 2009/0100396 discusses a method for addressing this situation. More specifically, the OPC is performed on the pattern in the individual cell to correct the shape of the pattern, and the plurality of cells subjected to the OPC is arranged to form the mask pattern. Then, the OPC is performed for the last time on the entire mask pattern. Since the patterns of each cell is already subjected to the OPC, the OPC on the entire mask needs not to be applied to some pattern elements having the images already corrected to be within the target range. Accordingly, the number of pattern elements to be corrected is reduced. As a result, the calculation amount in the OPC can be reduced.

In U.S. Pat. No. 7,873,929, an auxiliary pattern is arranged in a standard cell under a certain rule. Thus, the mask pattern can be generated with a smaller or no optical proximity effect produced when arranging a plurality of standard cells. In Japanese Patent Application Laid-Open No. 2005-84101, the OPC is performed with dummy patterns added on both sides of a pattern in a cell, and then the dummy patterns are removed and the resultant pattern is stored in the cell library.

US Patent Application Publication No. 2009/0100396 discusses the OPC of deforming the pattern in each cell, however, does not discuss the auxiliary pattern for achieving a higher resolution of the main pattern in a cell. Thus, the resolution improving effect of the auxiliary pattern cannot be obtained. In the U.S. Pat. No. 7,873,929, the auxiliary pattern is arranged only inside the cell. Thus, a sufficient resolution might not be achieved due to the limitation of auxiliary pattern arrangement. The dummy patterns discussed in the Japanese Patent Application Laid-Open No. 2005-84101 are placed not only in the cell but also on both sides of the cell in the OPC. The dummy patterns are removed when the cell is stored in the cell library. Thus, a sufficient resolution might not be achieved when the mask pattern is generated due to the absence of the dummy patterns in the cell selected from the cell library.

SUMMARY OF THE INVENTION

A method according to one aspect of the present invention for generating a pattern of a mask by arranging side by side a plurality of cells selected from a cell library containing a plurality of cells using a processor, includes defining a footprint of a main pattern in each cell, arranging side by side a first cell and a second cell, which has an auxiliary pattern outside of the footprint of the main pattern, in such a manner that the auxiliary pattern outside the footprint of the second cell is present in the footprint of the main pattern of the first cell, and generating the pattern of the mask by removing a pattern element of the auxiliary pattern, in a portion where a pattern element of the auxiliary pattern outside the footprint of the second cell is close to or overlaps with the main pattern in the first cell of the first cell and the second cell arranged side by side.

Further features of the present invention will become apparent from the following description of exemplary embodiments with reference to the attached drawings.

BRIEF DESCRIPTION OF THE DRAWINGS

FIG. 2 is a diagram illustrating cells A to D.

FIG. 3 is a diagram illustrating cells A' to D' each including an auxiliary pattern.

FIG. 11 is a diagram illustrating a modification of an allowable area.

FIG. 15 is a diagram illustrating cells A1 to D1 in a fourth comparative example.

DESCRIPTION OF THE EMBODIMENTS

Figure 1:
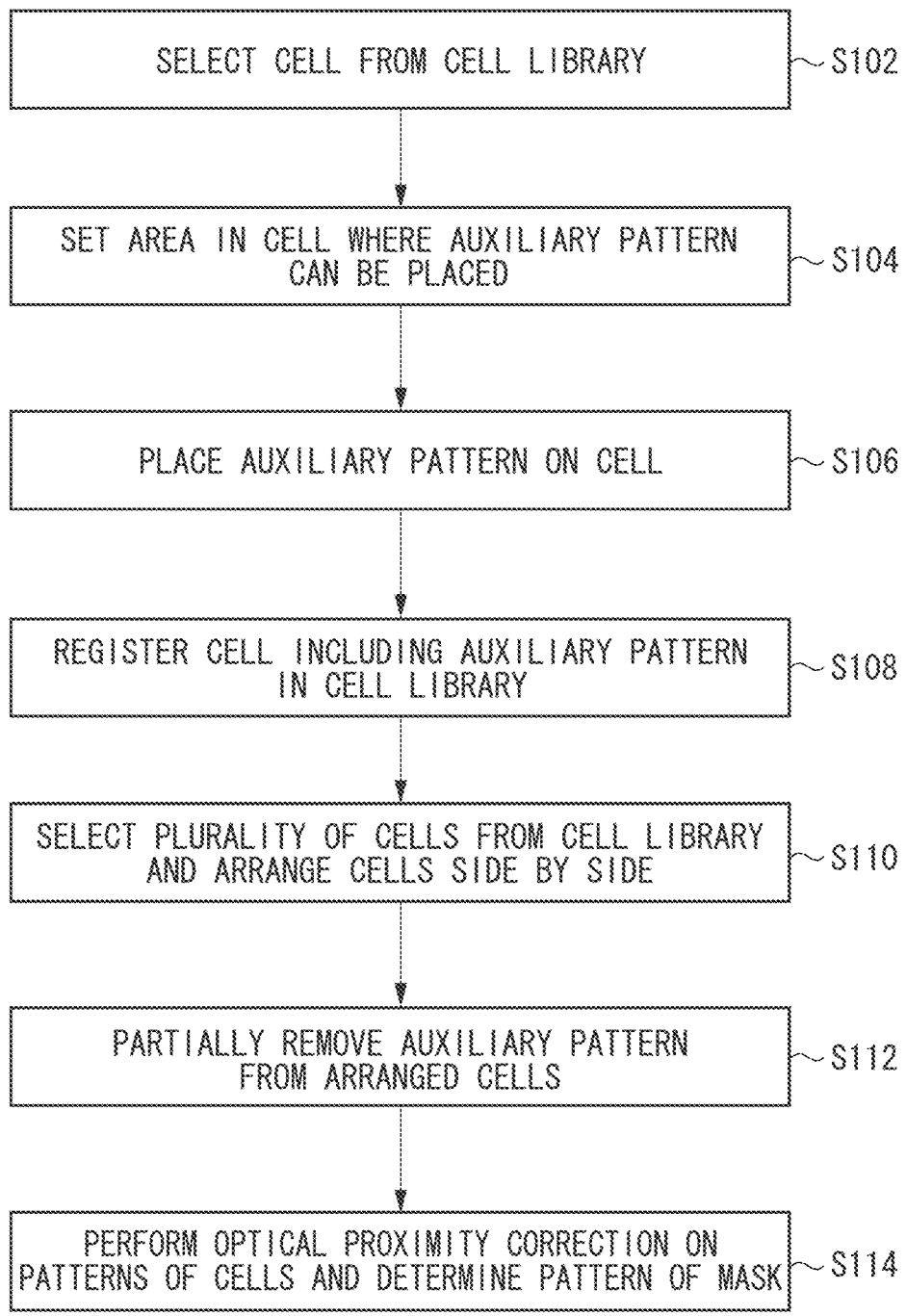
FIG. 1 is a flowchart illustrating a method for generating a mask pattern.

Elements of one embodiment may be implemented by hardware, firmware, software or any combination thereof. The term hardware generally refers to an element having a physical structure such as electronic, electromagnetic, optical, electro-optical, mechanical, electro-mechanical parts, etc. A hardware implementation may include analog or digital circuits, devices, processors, applications specific integrated circuits (ASICs), programmable logic devices (PLDs), field programmable gate arrays (FPGAs), or any electronic devices. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory, ROM, EPROM). Examples of firmware may include microcode, writable control store, micro-programmed structure. When implemented in software or firmware, the elements of an embodiment may be the code segments to perform the necessary tasks. The software/firmware may include the actual code to carry out the operations described in one embodiment, or code that emulates or simulates the operations. The program or code segments may be stored in a processor or machine accessible medium. The "processor readable or accessible medium" or "machine readable or accessible medium" may include any medium that may store information. Examples of the processor readable or machine accessible medium that may store include a storage medium, an electronic circuit, a semiconductor memory device, a read only memory (ROM), a flash memory, a Universal Serial Bus (USB) memory stick, an erasable programmable ROM (EPROM), a floppy diskette, a compact disk (CD) ROM, an optical disk, a hard disk, etc. The machine accessible medium may be embodied in an article of manufacture. The machine accessible medium may include information or data that, when accessed by a machine, cause the machine to perform the operations or actions described above. The machine accessible medium may also include program code, instruction or instructions embedded therein. The program code may include machine readable code, instruction or instructions to perform the operations or actions described above. The term "information" or "data" here refers to any type of information that is encoded for machine-readable purposes. Therefore, it may include program, code, data, file, etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

A first exemplary embodiment relates to a method for generating (forming) a pattern used in a lithography technique for manufacturing a semiconductor device, for example, a method for generating (forming) data of a mask pattern used in an exposure device that exposes a substrate with an illumination optical system that illuminates a mask and a projection optical system that projects an image of the mask pattern onto the substrate.

Figure 17:
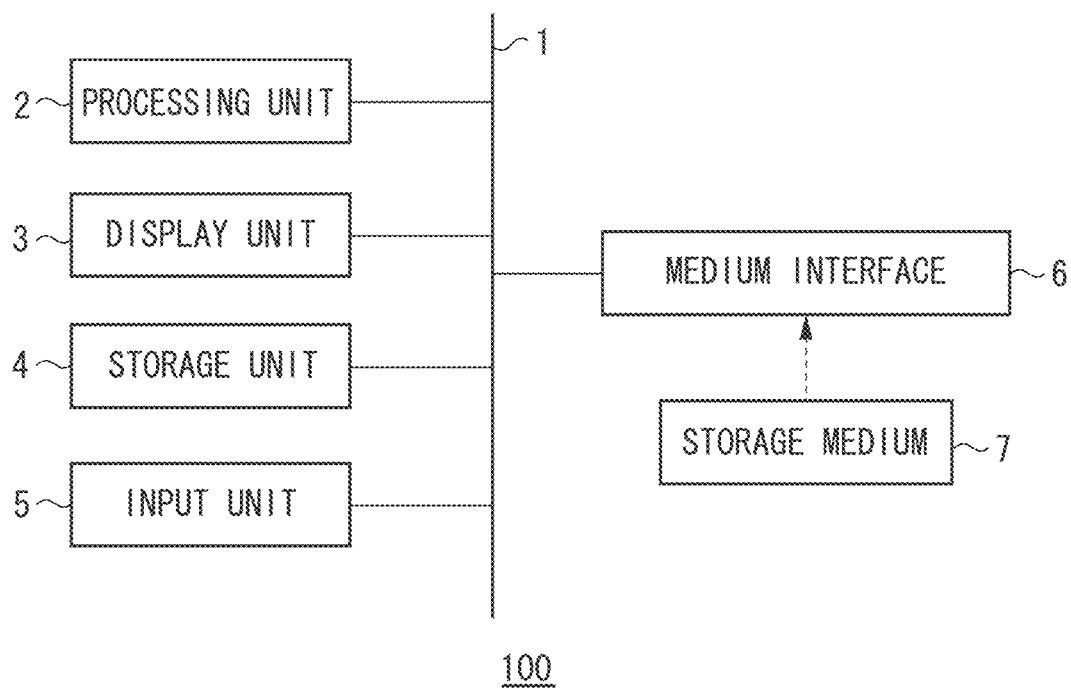
FIG. 17 is a diagram illustrating a configuration of a computer.

The method for generating the data of the mask pattern is performed as follows. A processing unit of a computer (information processing apparatus) reads out and executes a program, and the computer performs calculation by using data of the pattern. FIG. 17 illustrates a configuration of a computer 100 that executes the program for forming the mask pattern. The computer 100 includes a bus line 1, a processing unit 2, a display unit 3, a storage unit 4, an input unit 5, and a medium interface 6. The processing unit 2, the display unit 3, the storage unit 4, the input unit 5, and the medium interface 6 are connected to each other through the bus line 1. The medium interface 6 can be connected to a storage medium 7. The program for forming the mask pattern stored in the storage medium 7 is read by the medium interface 6 and is stored in the storage unit 4. Then, the processing unit 2 reads out and executes the program stored in the storage unit 4. The storage unit 4 stores the program for forming the mask pattern and the data used for the calculation. The processing unit 2, such as a central processing unit (CPU), a micro processing unit (MPU), a digital signal processor (DSP), or a field-programmable gate array (FPGA), includes a cache memory for temporal storage. The display unit 3 is a display device such as a display. The storage unit 4 is a memory or a hard disk. The input unit 5 is a keyboard, a mouse, or the like. The medium interface 6 is, for example, a compact disc (CD) drive, a universal serial bus (USB) interface, or the like. The storage medium 7 is a CD, a USB memory, or the like. Software and a program for implementing functions of the present exemplary embodiment may be executed by an information processing apparatus including a plurality of computers through a network or various storage media. The computers disposed at positions distant from each other, may transmit and receive data to and from each other through wired or wireless communications to execute various types of processing in the program. Processing units of the information processing apparatus constitute each means for executing steps described below.

The method for forming the mask pattern executed by the computer 100, is described below. FIG. 1 illustrates a flowchart of the method for forming the mask pattern executed by the computer 100.

In steps S102 to S108, a new cell library is created by adding an auxiliary pattern to a standard cell.

In step S102, the processing unit 2 of the computer 100 selects a cell used for forming a mask pattern from a cell library including a plurality of types of standard cells, and acquires data of the pattern in the selected cell. The acquired data may be pattern data of a cell selected from the cell library based on an instruction issued by a user through the input device 5, or pattern data of a cell automatically selected by the computer 100. The cell library is stored in the storage unit 4 (memory) of the computer 100. The data of the cell is acquired by reading out from the storage unit 4 which stores the cell library. The cell forms a basic pattern used as the mask pattern. Usually, the cell library includes dozens to hundreds of types of standard cells generally used as a circuit pattern. Each cell includes patterns different from each other. The cell library includes cell information such as the names and ranges of the cells, input-output pin information, a library exchange format (LEF) file including layout physical property information of a wiring layer, a library (LIB) file including fluctuation of a parasitic capacity and thermopotential of a transistor, logical circuit design data, and graphic design system (GDS) II data of a design value. A single cell includes a diffusion area, a gate, a contact, a metal part, a via hole, and the like of a transistor.

FIG. 2 illustrates an example of four standard cells. The standard cell actually includes a plurality of mask layers. However, only an example of a contact hole layer is illustrated to simplify the description. For example, a pattern (main pattern) of a standard cell A includes 12 contact holes (main pattern elements) 10 each having a square shape. Each main pattern element is a 100 nm×100 nm square. A rectangular footprint 12 of a cell represents a border line to another cell when the cells are arranged side by side in step S112 described below. In step S112, the cells are arranged side by side with no overlapping between the footprints 12. The cell library includes information about the footprint 12 as the range of the cell. Similarly, standard cells B, C, and D each include a plurality of contact holes 10 and the footprint 12.

Then, in step S104, the processing unit 2 of the computer 100 sets an allowable area 14 to each standard cell. The allowable area 14 is an area where an auxiliary pattern for achieving a higher resolution of the main pattern can be arranged. In the present exemplary embodiment, the allowable area 14 is an area obtained by widening the footprint 12 of each cell in the upper, lower, left, and right directions by 150 nm. Thus, the allowable area 14 is set to be wider than the footprint 12.

Figure 4:
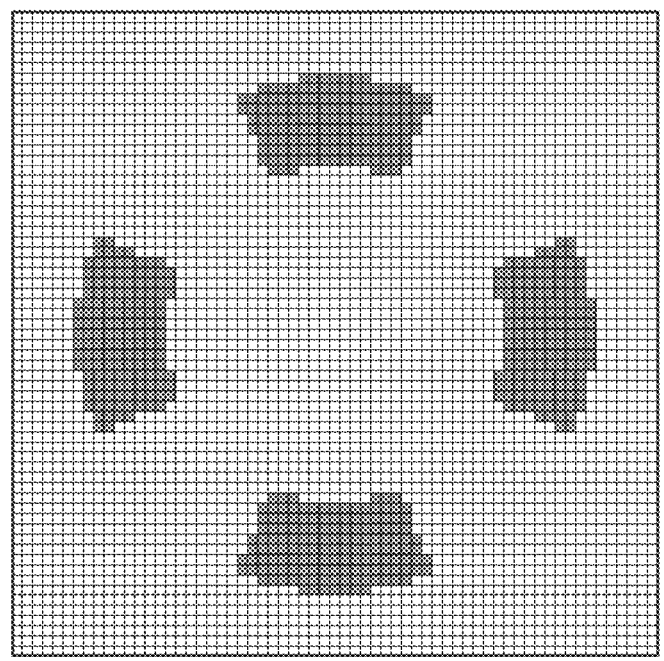
FIG. 4 is a diagram illustrating effective light source distribution.

Next, in step S106, the processing unit 2 of the computer 100 generates the auxiliary pattern based on the main pattern of each cell, and arranges the auxiliary pattern. The auxiliary pattern, which is also referred to as Sub Resolution Assist Feature (SRAF), is not configured to resolve, but is placed at a position for achieving a higher resolution of the main pattern. In the present exemplary embodiment, a two-dimensional transmission cross coefficient described in Japanese Patent Application Laid-Open No. 2008-040470 is used to calculate an approximate aerial image (optical image) of the main pattern 10 of the cells A to D, and auxiliary pattern elements 16 are placed at peak positions in the approximate aerial image. The approximate aerial image is calculated with the following parameters related to projection exposure. A numerical aperture (NA) of the projection optical system that projects the mask pattern onto the substrate is set to 0.85. An exposure wavelength is set to 193 nm (ArF laser beam). A projection magnification is set to 0.25×. Black areas in FIG. 4 represent light intensity distribution (effective light source distribution) on a pupil plane of the illumination optical system. The approximate aerial image is calculated with the cells A to D sufficiently disposed far from each other so as not to cause an optical proximity effect between the cells, thereby preventing the cells A to D from interacting. FIG. 3 illustrates cells A' to D' each including an auxiliary pattern. The auxiliary pattern includes a plurality of auxiliary pattern elements 16 illustrated as white squares. Each auxiliary pattern element 16 in the auxiliary pattern is smaller than the main pattern element 10 in the main pattern. The auxiliary pattern elements 16 of the auxiliary pattern are arranged within the footprint 12 of each cell and also in the allowable area 14 outside the footprint 12. Thus, the auxiliary pattern is not necessarily arranged within the footprint 12 of the cell. The auxiliary pattern element 16 on the border line between the footprint 12 and the allowable area 14 is determined to be in the footprint 12 when the center position of the auxiliary pattern element is within the footprint 12, and is determined to be outside the footprint 12 when the center position of the auxiliary pattern element is out of the footprint 12. The method for calculating the optical image is not limited to the method using the two-dimensional transmission cross coefficient, and another model based method may also be employed. More specifically, a pattern may be generated by calculating the optical image of the pattern by using another optical model. The method for forming the auxiliary pattern is not limited to the method using the optical model. The auxiliary pattern for achieving a higher contrast of the pattern image may be placed around the pattern image under a predetermined rule.

Then, in step S108, the processing unit 2 of the computer 100 registers the cells A' to D' obtained by arranging the auxiliary pattern in step S106, in the cell library that may be the cell library from which the cells A to D are selected in step S102, or may be another cell library. Alternatively, the OPC may be performed on the cells A' to D' to change the shape and the like of the main pattern and the auxiliary pattern, and the resultant cells A' to D' may be stored in the cell memory.

Next, the mask pattern is formed in steps S110 to S116.

Figure 5:
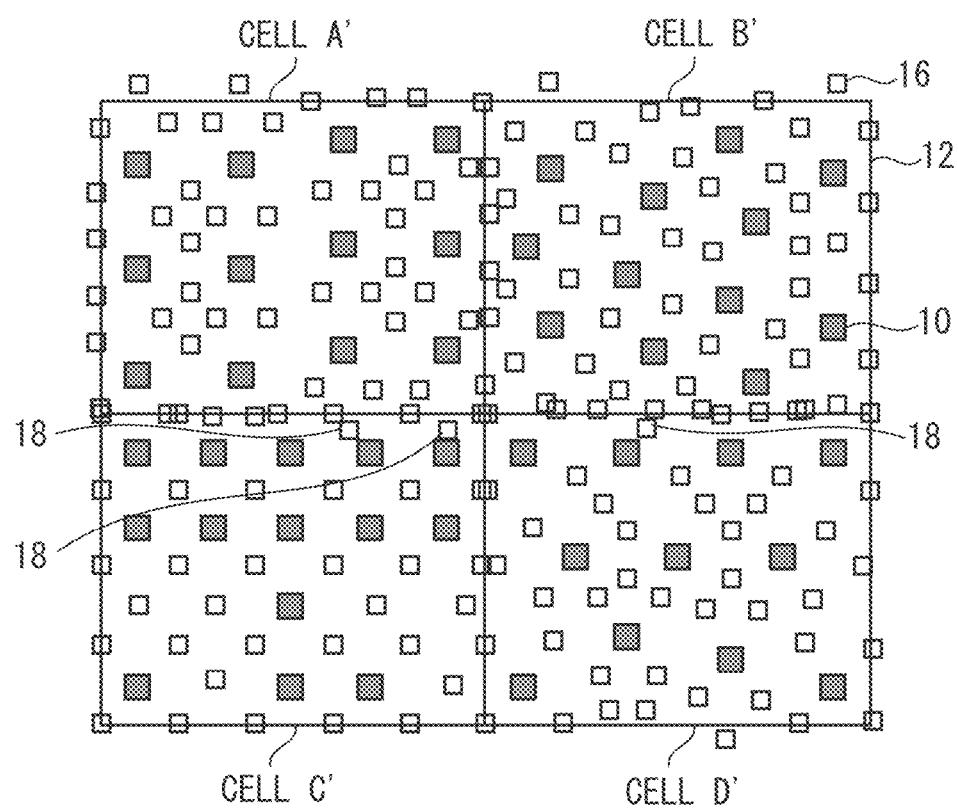
FIG. 5 is a diagram illustrating a mask pattern as a state where the cells A' to D' are arranged side by side.

First, in step S110, the processing unit 2 of the computer 100 selects a plurality of cells from the cell library and arranges the cells side by side on data of the mask in accordance with a logical circuit design. The pattern on the entire mask includes at least one pattern corresponding to an area of a single semiconductor chip. A pattern in the area of a single semiconductor chip is formed as a combination of a group of circuit patterns including a block cell as a set of functional blocks, an input/output (IO) unit indicating an input and output of data, and a standard cell each being a logic element. The configuration of arranging the cells A' to D' selected from the cell library side by side on the data of the mask is merely an example for simplifying the description of the present exemplary embodiment. The scale of the cell arrangement in an actual logic circuit is much larger, and thus a large number of cells is arranged. The cells to be arranged may include cells other than the cells A' to D', such as a cell including the auxiliary pattern only within the footprint, and a cell including no auxiliary pattern. FIG. 5 illustrates a state where the cells A' to D' are arranged with the footprints 12 in contact with each other without overlapping each other. The cells A' and C' are arranged in such a manner that the auxiliary pattern elements disposed outside the footprint of the cell A' (first cell) on the lower side of the first cell are in the footprint of the cell C' (second cell). The same applies to the cells A' and B', and to the cells B' and D'. According to the present exemplary embodiment, the plurality of cells is arranged with no gap in between. However, the cells may also be arranged with a gap in between.

Figure 6:
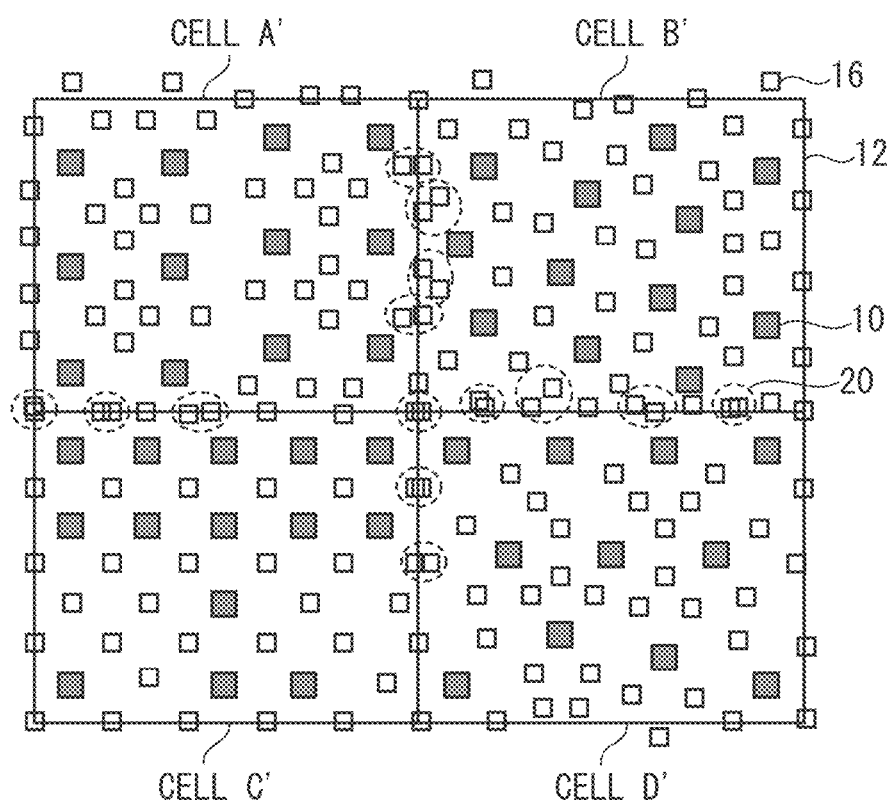
FIG. 6 is a diagram illustrating auxiliary pattern elements that are close to each other or overlap with each other.

Next, in step S112, the processing unit 2 of the computer 100 partially deletes the auxiliary pattern elements of a part of the auxiliary patterns in the cells A' to D' arranged side by side. For example, in the arrangement state in FIG. 5, auxiliary pattern elements 18 which are outside the footprint of the cell A' and too close to the main pattern as the resolution target in the cell C', are arranged within the footprint of the cell C'. The auxiliary pattern element 18 disposed outside the footprint of the cell A' and too close to the main pattern of the cell C' might adversely affect the resolution of the main pattern of the cell C', and the desired image might not be acquired due to the fact that the auxiliary pattern in the cell A' is not the auxiliary pattern for the main pattern in the cell C'. Thus, when an auxiliary pattern element of a first cell disposed outside the first cell is adjacent to or partially overlaps with the main pattern element of a second cell, arranged next to the first cell, the auxiliary pattern element of the first cell is removed. In the present exemplary embodiment, it is determined that the auxiliary pattern element is removed that has the center coordinates within 100 nm from the center coordinates of the main pattern element in vertical and lateral directions. The determination is based on the same rule as in a case where the auxiliary pattern elements are arranged in a standard cell. FIG. 6 illustrates a state where the auxiliary pattern elements 18 shown in FIG. 5 as the removal targets have been removed.

Figure 7:
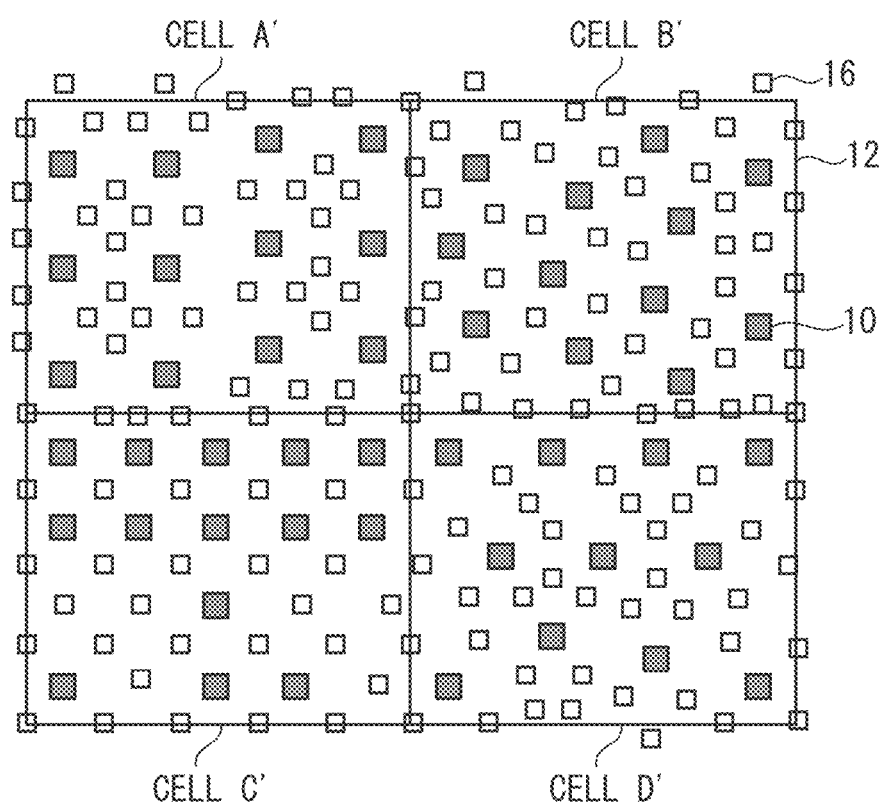
FIG. 7 is a diagram illustrating a pattern after partially removing the auxiliary pattern.

Next, either one of the auxiliary pattern elements disposed too close to each other is removed. For example, in the state illustrated in FIG. 6, there is a portion 20 where the auxiliary pattern element disposed outside the footprint of the cell A' overlaps with the auxiliary pattern element disposed within the footprint of the cell C'. The auxiliary pattern element that is disposed outside the footprint of the cell A' and is adjacent to or overlaps with the auxiliary pattern element of the cell C' might be involved in the resolution. Thus, in a portion where the auxiliary pattern element of the first cell outside the footprint of the first cell is close to or overlaps with the auxiliary pattern element of the second cell, either one of the auxiliary pattern element of the first cell and the auxiliary pattern element of the second cell is removed. In the present exemplary embodiment, when a distance between center coordinates of the auxiliary pattern elements is not larger than 100 nm in the vertical and the horizontal directions, it is determined that one of the auxiliary pattern elements is to be removed. Thus, one of the auxiliary pattern elements in each of the portions 20 (within a dotted line frame) in FIG. 6 is to be removed. Similarly, in a portion where one of the auxiliary pattern element within the footprint of one cell and the auxiliary pattern element within the footprint of the other cell are close to each other or overlap with each other, one of the auxiliary pattern element is to be removed. In the present exemplary embodiment, of the plurality of auxiliary pattern elements in the portion 20, the auxiliary pattern element closer to the main pattern is removed. When two of the three auxiliary pattern elements are to be removed, the auxiliary pattern elements other than the one closest to the barycenter of the three auxiliary pattern elements are removed. FIG. 7 illustrates a state where the auxiliary pattern elements have been thus removed.

Then, in step S114, the processing unit 2 of the computer 100 performs the OPC on the pattern illustrated in FIG. 7, and the resultant pattern is determined as the mask pattern.

Figure 8:
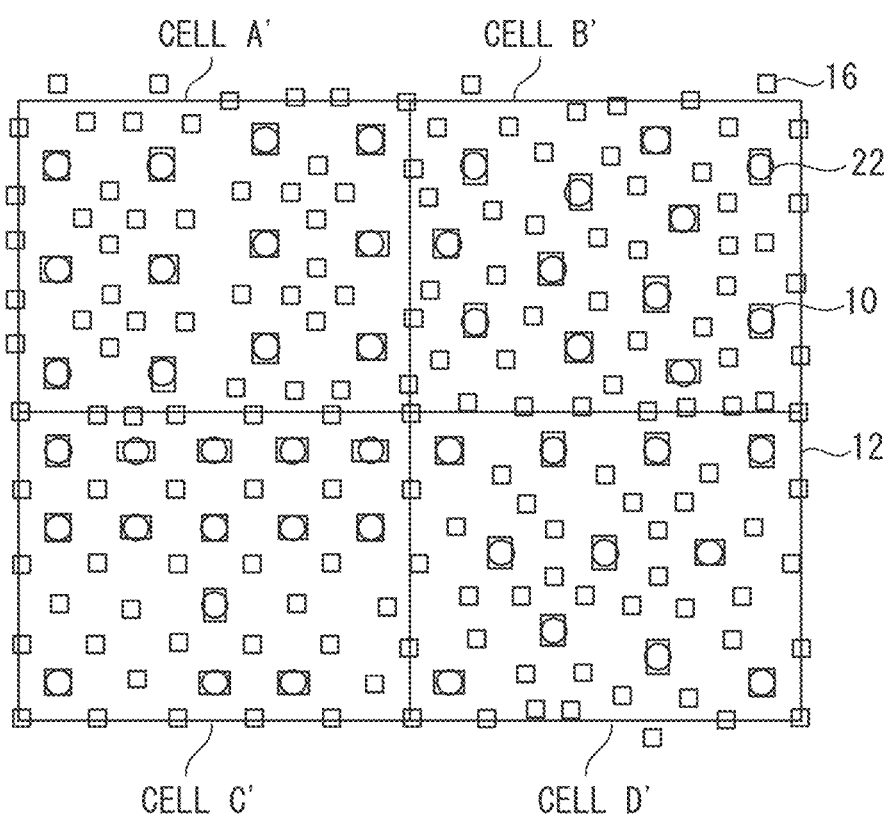
FIG. 8 is a diagram illustrating a mask pattern determined in a first exemplary embodiment.

FIG. 8 illustrates a result of the OPC processing. In the present exemplary embodiment, while through the OPC processing, the position and the length of a side of the main pattern are corrected, the position and the size of the auxiliary pattern remain unchanged.

In FIG. 8, circles 22 overlapping with the main pattern elements 10 represent the contour of the image of the main pattern. A focal depth as one index of a lithography margin (resolution) is checked. More specifically, widths of the image of the main pattern were checked by varying defocusing amounts. It was found that with a common focal depth of 165 nm, the widths of the images of all the main pattern elements fall within a range of 100±10 nm. Furthermore, the auxiliary pattern was not resolved.

Figure 9:
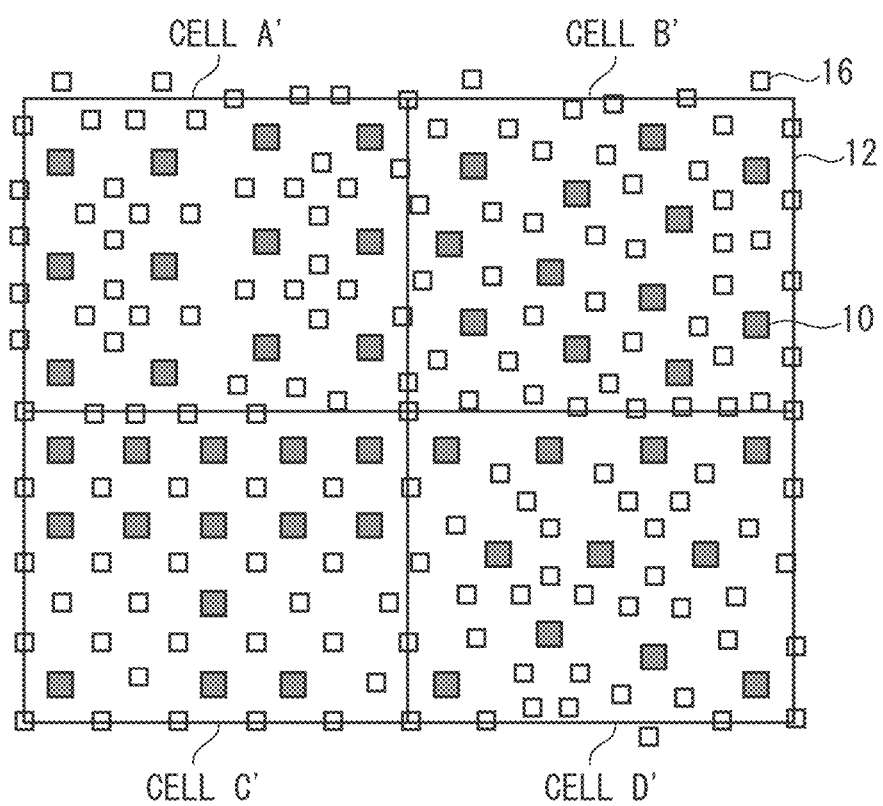
FIG. 9 is a diagram illustrating a pattern after partially removing the auxiliary pattern in a second exemplary embodiment.

Next, an example where the auxiliary pattern is partially removed in step S112 in FIG. 1, is described as a second exemplary embodiment. Up to the state illustrated in FIG. 6, processing is the same as that in the first exemplary embodiment. In the present exemplary embodiment, in a portion 20 where the auxiliary pattern elements are close to each other or overlap with each other, one of the auxiliary pattern elements is removed, and the remaining auxiliary pattern element is moved to a middle position between the auxiliary pattern elements. When two of three auxiliary pattern elements are to be removed, one of the two auxiliary pattern elements closest to each other is removed. Then, the remaining element is moved to the middle position between the two auxiliary pattern elements. When remaining auxiliary pattern elements after this processing are close to each other or overlap with each other, the removing and the moving processing described above are repeated. FIG. 9 illustrates a state of the pattern as a result of such processing. The process of moving the remaining auxiliary pattern element, removing all of the auxiliary pattern elements which are the removing targets, and newly placing an auxiliary pattern element at the middle position produce the same result and thus are regarded as the same.

Figure 10:
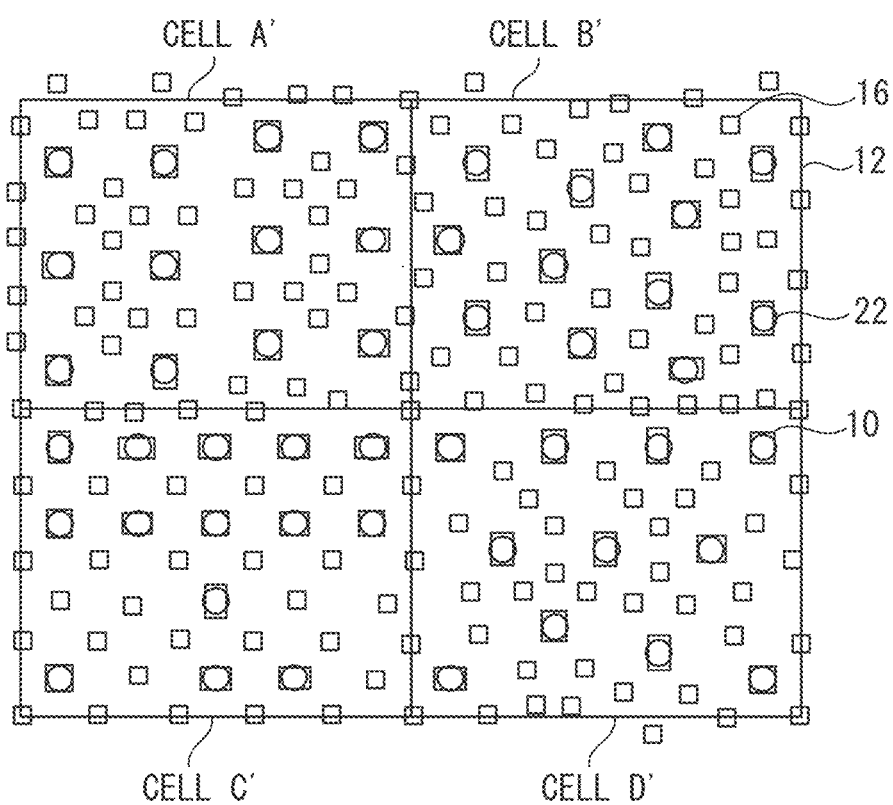
FIG. 10 is a diagram illustrating a mask pattern determined in the second exemplary embodiment.

Then, in step S114, the OPC is performed on the pattern illustrated in FIG. 9. FIG. 10 illustrates a pattern as a result of the OPC. The OPC performed in the second exemplary embodiment is the same as that in the first exemplary embodiment. Here, widths of the images of the main pattern elements were checked by varying defocusing amounts. It was found that with a common focal depth of 165 nm, the widths of the images of all the main pattern elements fall within a range of 100±10 nm. Furthermore, the auxiliary pattern was not resolved. Thus, it has been confirmed that the effect that is the same as that in the first exemplary embodiment is also obtained in the second exemplary embodiment.

In the first exemplary embodiment, when a allowable area 14 where the auxiliary pattern can be arranged is widened, an effect of the auxiliary pattern becomes larger, and thus a lithography margin tends to become larger. However, with respect to the auxiliary pattern elements which are placed farther from the footprint of the cell, only a small effect is produced. Furthermore, a large number of auxiliary pattern elements is to be removed after a plurality of cells is arranged to form a mask pattern, therefore a calculation amount for removing the auxiliary pattern element is increased. Thus, the allowable area 14 does not necessarily become more effective as its size increases, and thus is to have an appropriate size. According to the present exemplary embodiment, in the allowable area 14, the footprint 12 is widened in all four directions by 150 nm. When a standardized value k1=D×NA/λ, k1=150/193×0.85=0.66, where D represents the distance, λ represents the exposure wavelength, and NA represents the numerical aperture of the projection optical system. How far the auxiliary pattern element can be disposed from the footprint 12 of the cell to good effect, depends on the arrangement of the main pattern, the effective light source distribution, the NA of the projection optical system, and the exposure wavelength. The auxiliary pattern element disposed at a distance of k1 that exceeds 1.5 is much less effective. Thus, the distance between the outer circumference of the allowable area 14 and the outer circumference of the footprint 12 of a cell is k1 that is not larger than 1.5.

In the first exemplary embodiment, the allowable area 14 is an area obtained by expanding the footprint 12 in the four directions. However, this is not limitative. For example, as illustrated in FIG. 11, an allowable area 30 may have an outer circumference (dotted line) separated by a fixed distance from the main pattern elements. In FIG. 11, the allowable area 30 is an area on the outer side of the footprint 12 of a cell within 280 nm from the main pattern elements 10 in directions orthogonal to the outer circumference of the footprint 12. FIG. 11 illustrates cells A2 to D2 obtained by arranging an auxiliary pattern in the area 30 thus set.

In the first exemplary embodiment, when the distance between the center coordinates of an auxiliary pattern element and the center coordinates of a main pattern element or another auxiliary pattern element is equal to or shorter than 100 nm in the vertical and the lateral directions, it is determined that the auxiliary pattern element is to be removed. However, the element to be removed may be determined in other ways. The element to be removed may be determined based on a distance between centers or a distance between edges of a plurality of pattern elements (a main pattern element or an auxiliary pattern element). The threshold value may be a value other than 100 nm. The threshold value of the distance between the main pattern element and the auxiliary pattern element, and the threshold value of a distance between the auxiliary pattern elements may be different. A rule applied to the determination may be different from the rule used in arranging the auxiliary pattern in the cell according to the first exemplary embodiment. For example, a case is considered where the shortest distance between the actually placed auxiliary pattern in the cell and the main pattern is 130 nm even if the threshold of the distance between the auxiliary pattern element and the main pattern element is set to be 100 nm when the auxiliary pattern is placed on the cell. In this case, the position at a distance of 100 nm from the main pattern element may not be suitable as the position where the auxiliary pattern is placed on the cell. Thus, the threshold of the distance between the auxiliary pattern element and the main pattern element after a plurality of cells is arranged as a mask pattern may be set to be a value larger than 100 nm and not larger than 130 nm.

In the first exemplary embodiment, the distance between the auxiliary pattern element and the main pattern element or the distance between a plurality of auxiliary pattern elements is to be analyzed. The distance may be acquired for all the auxiliary pattern elements, or only for the auxiliary pattern elements close to the border line of the footprint of the cell. In addition, an identifier may be provided to auxiliary pattern elements that are disposed close to the border line of the footprint of a cell and can be too close to the main pattern element or another auxiliary pattern element after a plurality of cells is arranged side by side. Then, the distance to the other pattern element (a main pattern element or an auxiliary pattern element) may be obtained only with respect to the auxiliary pattern element provided with the identifier. The calculation amount can be reduced by thus reducing the number of targets for which the distance is to be obtained.

Figure 12:
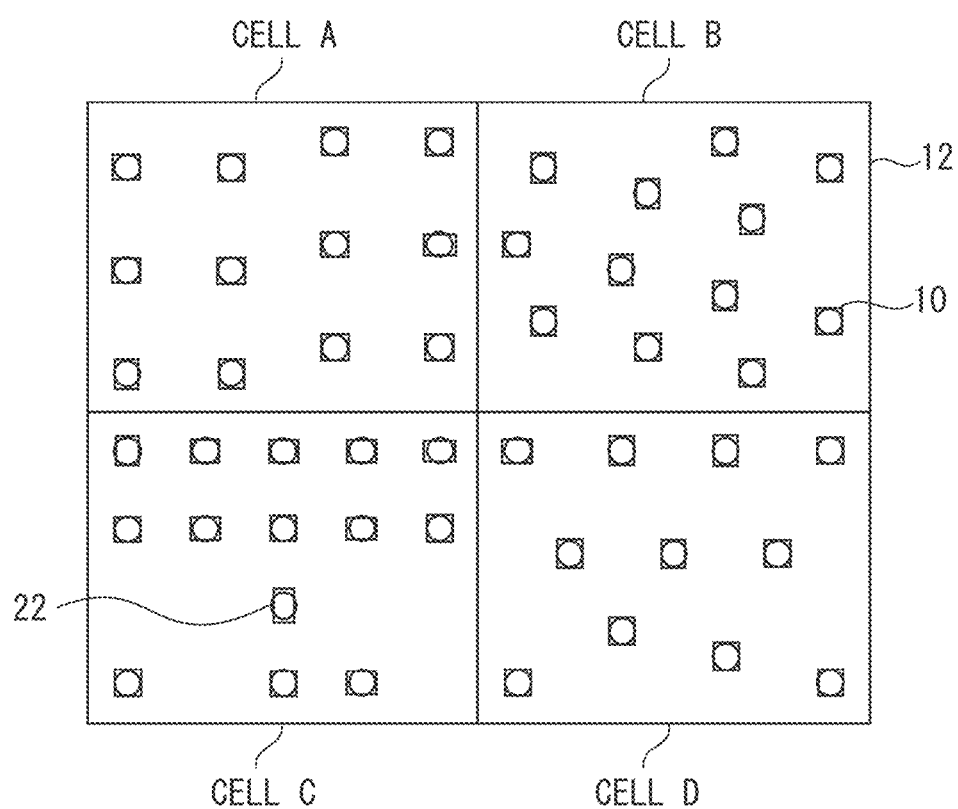
FIG. 12 is a diagram illustrating a mask pattern according to a first comparative example.

A first comparative example is described in which no auxiliary pattern is arranged. The plurality of standard cells A to D provided with no auxiliary pattern illustrated in FIG. 2 is arranged side by side to form the mask pattern, and the OPC is performed on the main patterns. The result is illustrated in FIG. 12. The circles 22 represent a contour of an image of a pattern. Widths of the images of the main pattern elements were checked by varying defocusing amounts. It was found that with a common focal depth of 146 nm, the widths of the images of all the main pattern elements fall within a range of 100±10 nm. The common focal depth in the first exemplary embodiment is 165 nm, and thus the method for forming the mask pattern according to the first exemplary embodiment can achieve a larger focal depth (lithography margin).

Figure 13:
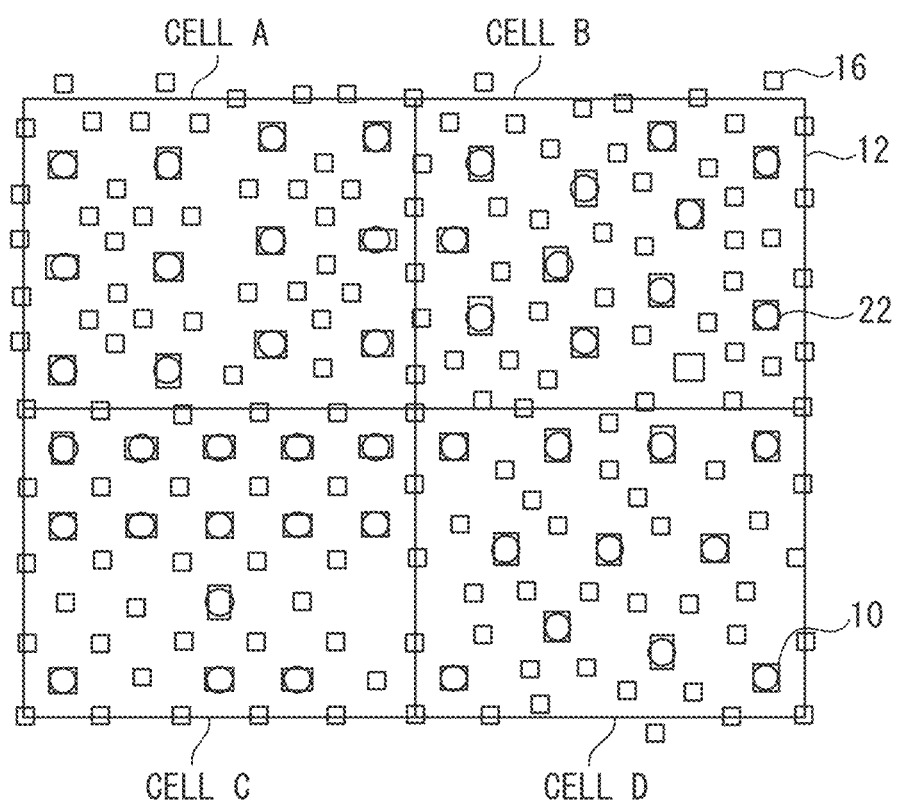
FIG. 13 is a diagram illustrating a mask pattern according to a second comparative example.

Next, a second comparative example is described that is an example where the auxiliary patterns are placed only after a plurality of cells is arranged side by side to form the mask pattern. The plurality of cells A to D provided with no auxiliary pattern is arranged side by side as it is to form the mask pattern as illustrated in FIG. 2, and then the auxiliary pattern is arranged. Also in the present comparative example, an approximate aerial image is calculated using the two-dimensional transmission cross coefficient, and the auxiliary pattern is arranged based on the approximate aerial image. After the auxiliary pattern is arranged, the OPC as in the first exemplary embodiment is performed on the main pattern. FIG. 13 illustrates the resultant mask pattern and the contour of the image in the mask pattern. Widths of the images of the main pattern elements were checked by varying defocusing amounts. It was found that with a common focal depth of 161 nm, the widths of the images of all the main pattern elements fall within a range of 100±10 nm. Thus, the effect is almost the same as or is slightly lower than that in the first exemplary embodiment. However, an area of an actual chip of a semiconductor device is several square millimeters whereas an area where the auxiliary pattern can be arranged using a single approximate aerial image map is several square micrometers. Thus, in the method according to the second comparative example, the approximate aerial image is to be calculated for several millions of times. On the other hand, in the method for forming a pattern according to the first exemplary embodiment, the calculation for arranging the auxiliary pattern is to be performed only once on each standard cell. Since the standard cell library includes several hundreds of types of the standard cells, the calculation amount is extremely smaller than that in the second comparative example.

Figure 14:
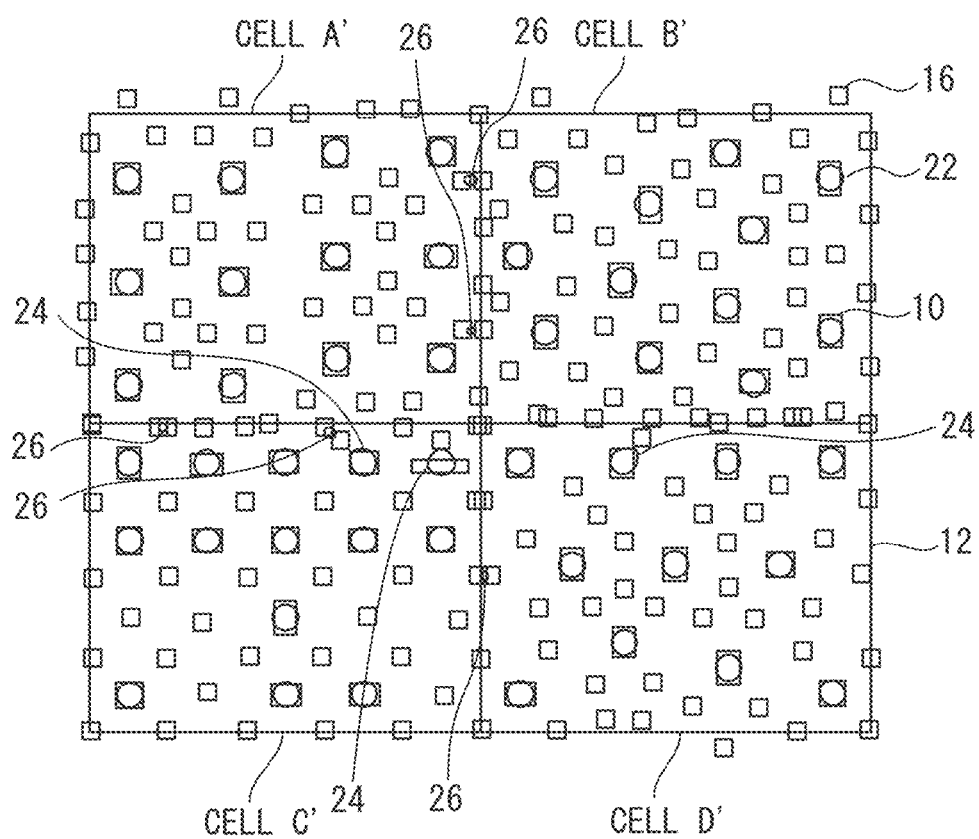
FIG. 14 is a diagram illustrating a mask pattern according to a third comparative example.

A third comparative example is described in which cells arranged side by side to form the mask pattern include an auxiliary pattern outside the footprint 12. First, the cells A' to D' having the auxiliary pattern outside the footprint 12 of the main pattern of the cells as illustrated in FIG. 3, are arranged side by side, and this pattern is determined as the mask pattern without removing auxiliary pattern elements as illustrated in FIG. 5. Then, the OPC is performed on the main pattern. FIG. 14 illustrates the resultant mask pattern and contours of images in the mask pattern. Three contours 24 in FIG. 14 are not a perfect circular shape due to the adjacent auxiliary pattern elements. Furthermore, in portions 26, the auxiliary pattern elements are arranged too close to each other and thus are resolved. Accordingly, this mask pattern should not be actually used.

Figure 16:
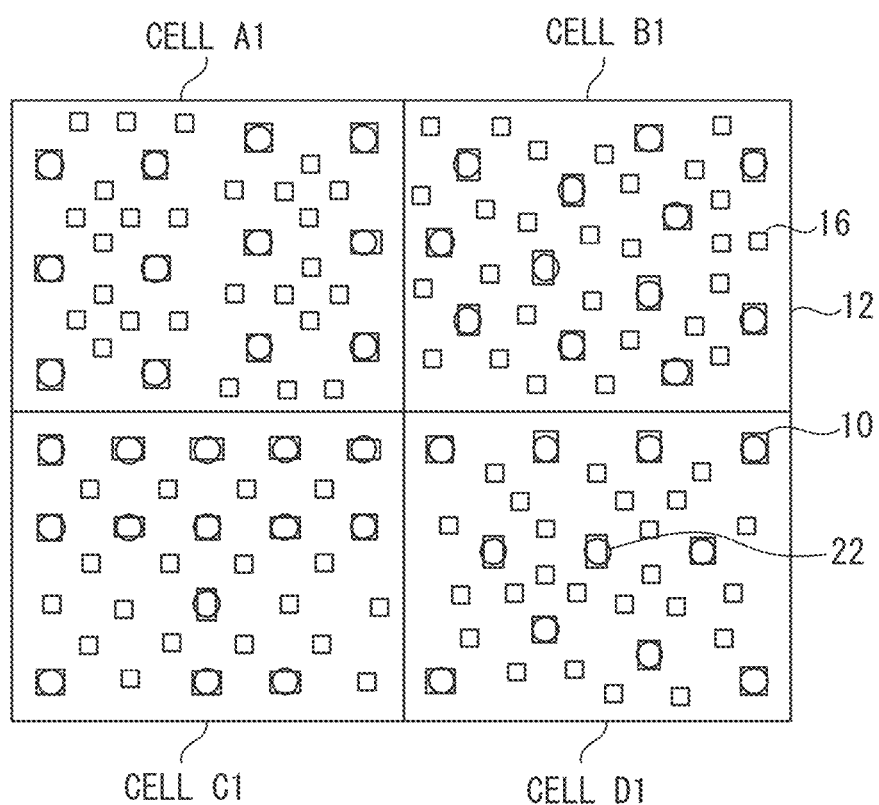
FIG. 16 is a diagram illustrating a mask pattern in the fourth comparative example.

A fourth comparative example is described in which the auxiliary pattern is not arranged near the outer circumference of the footprint 12 of the cell or outside the footprint 12. As illustrated in FIG. 15, an inner area 28 which keeps a distance of 50 nm or longer from the outer circumference of the footprint 12 of each cell is set. Then, only the auxiliary pattern elements having the center coordinates within the area 28 are arranged in the area 28. FIG. 15 illustrates cells A1 to D1 in which the auxiliary patterns are only arranged within the area 28. Then, the cells A1 to D1 are arranged side by side to form the mask pattern. In the present comparative example, no matter how the plurality of cells is arranged to form the mask pattern, the auxiliary pattern elements will never be too close to the main pattern element or too close to each other. Next, the OPC is performed on the main patterns in the cells A1 to D1. FIG. 16 illustrates the resultant mask pattern and contours of the mask pattern image. Widths of the images of the main pattern elements were checked by varying defocusing amounts. It was found that with a common focal depth of 151 nm, the widths of the images of all the main pattern elements fall within a range of 100±10 nm. Thus, the method for manufacturing the mask pattern according to the first exemplary embodiment can achieve a larger focal depth (lithography margin).

As described above, a plurality of cells is arranged side by side to form the mask pattern with the auxiliary pattern arranged not only in the footprint 12 of the cell but also outside the footprint 12 in the first and the second exemplary embodiments. Then, the auxiliary pattern elements that are too close to or overlap with another pattern elements (main pattern elements or auxiliary pattern elements) are removed. Therefore, the mask pattern with excellent resolution can be achieved with the first and the second exemplary embodiments.

A third exemplary embodiment is described. The data of the mask pattern formed in the exemplary embodiments described above is converted into a data format for inputting data to a mask manufacturing apparatus (drawing apparatus), and the resultant data is input to the mask manufacturing apparatus. The mask manufacturing apparatus draws the pattern on a mask blanks based on the input data to manufacture the mask.

The manufactured mask is conveyed into the exposure device. The exposure device illuminates the manufactured mask under a set exposure condition (the effective light source distribution, the exposure amount, a stage movement speed, and the like) to expose photoresist on a substrate to an image of the projected mask pattern.

A method for manufacturing a device (a semiconductor IC device, a liquid crystal display device, and the like) by using the exposure device is described. The device is manufactured through exposing a substrate (a wafer, a glass substrate, and the like) coated with the photoresist with the exposure device, developing the substrate (photoresist), and other known procedures including etching, resist stripping, dicing, bonding, packaging, and the like. With the present method for manufacturing a device, a device with a higher quality than conventional devices can be manufactured.

The suitable embodiments of the present invention has been described. Naturally, the present invention is not limited to the exemplary embodiments described above, and the exemplary embodiments can be modified and changed in various ways without departing from the spirit of the present invention. For example, in step S108 of the first exemplary embodiment, the cells A' to D' including the auxiliary pattern are registered in the cell library. However, step 108 can be omitted. In such a case, the processing proceeds from step S106 to step S110 where the cells A' to D', each including the auxiliary pattern generated in step S106 are arranged side by side to form the mask pattern. When a cell including the auxiliary pattern outside the footprint of the main pattern is arranged next to another cell, a portion of the auxiliary pattern that is outside the footprint and that will be close to or will overlap with the other cell may be removed in advance. A computer or an application that executes step S102 to S108 may be different from a computer or an application that executes step S110 to S114.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-149015, filed Jul. 22, 2014, which is hereby incorporated by reference herein in its entirety.

What is claimed is:

1. A method for generating a pattern of a mask used for a mask manufacturing method for manufacturing the mask by arranging side by side a plurality of cells selected from a cell library containing a plurality of cells using a processor, the method comprising:

defining a footprint of a main pattern which is resolved in a first cell and a second cell;

arranging side by side the first cell and the second cell, the second cell having an auxiliary pattern which assists resolution of a main pattern of the second cell and is not resolved outside the footprint of the main pattern of the second cell, in such a manner that the auxiliary pattern outside the footprint of the second cell is present in the footprint of the main pattern of the first cell; and generating the pattern of the mask by removing a pattern element of the auxiliary pattern in a portion where a pattern element of the auxiliary pattern outside the footprint of the second cell overlaps with the pattern of the first cell, wherein the mask manufacturing method comprises a step of manufacturing the mask based on data of the generated pattern.

2. The method according to claim 1, wherein the generating includes removing the pattern element of the auxiliary pattern in the second cell in a portion where a pattern element of the auxiliary pattern in the second cell overlaps with a pattern element of the main pattern in the first cell.

3. The method according to claim 1,
wherein the first cell includes a pattern element of an auxiliary pattern, and
wherein the generating includes removing the pattern element of the auxiliary pattern of the first cell or the second cell, in a portion where the pattern element of the auxiliary pattern in the second cell overlaps with the pattern element of the auxiliary pattern in the first cell.

4. The method according to claim 3, wherein the generating includes changing a position of the pattern element of the auxiliary pattern that have not been removed and left, in a portion where the pattern element of the auxiliary pattern in the second cell overlaps with the pattern element of the auxiliary pattern in the first cell.

5. The method according to claim 1, further comprising:
setting an allowable area in which the auxiliary pattern can be arranged outside of the footprint of the second cell selected from the cell library; and
generating the auxiliary pattern in the allowable area, wherein
the arranging includes arranging the first cell and the second cell in such a manner that the auxiliary pattern formed in the allowable area overlaps with the footprint of the main pattern of the first cell.

6. The method according to claim 1, wherein in the arranging, the first cell and the second cell are arranged side by side in such a manner that the footprint of the first cell comes into contact with the footprint of the second cell.

7. The method according to claim 5, wherein a distance between an outer circumference of the allowable area and an outer circumference of the footprint is set to distance D or smaller than the distance D where $1.5 = D \times NA/\lambda$, NA is a numerical aperture of a projection optical system, and $\lambda$ is an exposure wavelength.

8. The method according to claim 5, wherein an outer circumference of the allowable area is separated from each position of the pattern elements of the main pattern of the cell by a fixed distance.

9. The method according to claim 1, wherein the second cell includes the auxiliary pattern within the footprint of the main pattern.

10. The method according to claim 1, wherein the first cell includes the auxiliary pattern within and out of the footprint of the main pattern.

11. A method for manufacturing a mask comprising:
generating a mask pattern with the method for generating a pattern according to claim 1; and
manufacturing a mask by using data of the generated mask pattern.

12. An exposure method comprising:
manufacturing a mask by using the method for manufacturing a mask according to claim 11; and
exposing a substrate by using the manufactured mask.

13. A method for manufacturing a device comprising:
exposing a substrate by the exposure method according to claim 12; and
developing the exposed substrate.

14. A non-transitory storage medium storing a program for causing an information processing apparatus to execute the method for generating a pattern according to claim 1.

15. The storage medium according to claim 14, wherein the generating includes removing the pattern element of the auxiliary pattern in the second cell in a portion where a pattern element of the auxiliary pattern in the second cell overlaps with a pattern element of the main pattern in the first cell.

16. The storage medium according to claim 14,
wherein the first cell includes a pattern element of an auxiliary pattern, and
wherein the generating includes removing the pattern element of the auxiliary pattern of the first cell or the second cell, in a portion where the pattern element of the auxiliary pattern in the second cell overlaps with the pattern element of the auxiliary pattern in the first cell.

17. The storage medium according to claim 14, further comprising:
setting an allowable area in which the auxiliary pattern can be arranged outside of the footprint of the second cell selected from the cell library; and
generating the auxiliary pattern in the allowable area, wherein
the arranging includes arranging the first cell and the second cell in such a manner that the auxiliary pattern formed in the allowable area overlaps with the footprint of the main pattern of the first cell.

18. The storage medium according to claim 14, wherein in the arranging, the first cell and the second cell are arranged side by side in such a manner that the footprint of the first cell comes into contact with the footprint of the second cell.

19. The storage medium according to claim 14, wherein the second cell includes the auxiliary pattern within the footprint of the main pattern.

20. An information processing apparatus comprising a processor configured to generate a pattern of a mask used for a mask manufacturing method for manufacturing the mask by arranging side by side a plurality of cells selected from a cell library containing a plurality of cells, the processor comprising:
a unit for defining a footprint of a main pattern which is resolved in a first cell and a second cell;
a unit for arranging side by side the first cell and the second cell, the second cell having an auxiliary pattern which assists resolution of a main pattern of the second cell and is not resolved outside the footprint of the main pattern of the second cell, in such a manner that the auxiliary pattern outside the footprint of the second cell is present in the footprint of the main pattern of the first cell; and
a unit for generating the pattern of the mask by removing a pattern element of the auxiliary pattern in a portion where a pattern element of the auxiliary pattern outside the footprint of the second cell overlaps with the pattern of the first cell,
wherein the mask manufacturing method comprises a step of manufacturing the mask based on data of the generated pattern.

* * * * *